United States Patent
Chen et al.

(10) Patent No.: US 11,177,827 B2
(45) Date of Patent: Nov. 16, 2021

(54) ENCODER SIGNAL SAMPLING METHOD AND DEVICE

(71) Applicant: QKM TECHNOLOGY (DONG GUAN) CO., LTD, Guangdong (CN)

(72) Inventors: Lihui Chen, Guangdong (CN); Jinbo Shi, Hong Kong (CN); Rongkui Zheng, Guangdong (CN); Bin Wang, Guangdong (CN); Jiang Liu, Guangdong (CN)

(73) Assignee: QKM TECHNOLOGY (DONG GUAN) CO., LTD, Guangdong (CN)

( * ) Notice: Subject to any disclaimer, the term of this patent is extended or adjusted under 35 U.S.C. 154(b) by 0 days.

(21) Appl. No.: 17/254,026

(22) PCT Filed: Jul. 1, 2019

(86) PCT No.: PCT/CN2019/094159
§ 371 (c)(1),
(2) Date: Dec. 18, 2020

(87) PCT Pub. No.: WO2020/001658
PCT Pub. Date: Jan. 2, 2020

(65) Prior Publication Data
US 2021/0266011 A1    Aug. 26, 2021

(30) Foreign Application Priority Data
Jun. 29, 2018 (CN) .......................... 201810701313.8

(51) Int. Cl.
*H03M 7/30* (2006.01)
*H03K 5/1252* (2006.01)

(52) U.S. Cl.
CPC ........ *H03M 7/6011* (2013.01); *H03K 5/1252* (2013.01)

(58) Field of Classification Search
CPC . H03M 7/6011; H03M 1/1245; H03K 5/1252
(Continued)

(56) References Cited

U.S. PATENT DOCUMENTS

| 6,323,786 B1* | 11/2001 | Sakuma | G01P 3/486 341/13 |
| 8,552,892 B2* | 10/2013 | Taylor | A61B 5/14532 341/122 |
| 2004/0178936 A1 | 9/2004 | Lee et al. | |

FOREIGN PATENT DOCUMENTS

| CN | 103644924 A | 3/2014 |
| CN | 105827248 A | 8/2016 |

(Continued)

OTHER PUBLICATIONS

CNIPA, "International Search Report," dated Aug. 29, 2019, International Application No. PCT/CN2019/094159.

*Primary Examiner* — Khai M Nguyen
(74) *Attorney, Agent, or Firm* — Terrence J. Edwards; TechLaw Ventures, PLLC

(57) ABSTRACT

Disclosed are an encoder signal sampling method and device. According to the method and device, a data frequency of the encoder is obtained, a clock frequency is determined according to the data frequency, a high-frequency clock signal is generated based on the clock frequency, an input signal of the encoder is sampled based on the high-frequency clock signal to obtain a sampled signal, and finally denoising processing is performed on the sampled signal based on a preset algorithm by a processor.

20 Claims, 3 Drawing Sheets

(58) Field of Classification Search
USPC .......................................................... 341/50
See application file for complete search history.

(56) References Cited

FOREIGN PATENT DOCUMENTS

| | | |
|---|---|---|
| CN | 108039888 A | 5/2018 |
| CN | 108777578 A | 11/2018 |

* cited by examiner

ENCODER SIGNAL SAMPLING METHOD AND DEVICE

CROSS-REFERENCE TO RELATED APPLICATION

This is a national stage application filed under 37 U.S.C. 371 based on International Patent Application No. PCT/CN2019/094159, filed Jul. 1, 2019, which claims priority to Chinese Patent Application No. 201810701313.8 filed Jun. 29, 2018, the disclosures of which are incorporated herein by reference in their entireties.

TECHNICAL FIELD

The present disclosure relates to the technical field of servo control, and in particular, to an encoder signal sampling method and device.

BACKGROUND

The use of motors in industrial automation applications is essential, especially with the rise of Industry 4.0 and the state-supported manufacturing industry. Absolute encoders are widely used in motor systems in production workshops and industrial robots.

In a process of acquiring a signal of the absolute encoder, in the existing art, single signal acquisition is usually performed with a logic chip according to a specific beat and a fixed communication clock edge, then a cyclic redundancy check (CRC) is performed on the collected signal, and if the CRC indicates no error, an acquired position is fed back to a position loop for corresponding loop control. However, when the logic chip samples the encoder signal, since the encoder signal is an asynchronous sampled signal for the logic chip and there are often various interferences in the industrial field, sampling errors often occur in the logic chip in sampling the encoder input signal, and a noise signal is mistakenly regarded as valid data, which results in the failure to pass the CRC check, the real-time update of the absolute encoder position information and ultimately the inability to accurately control the motor movement, and thus brings instability to the loop control or greatly reduces the performance index of the system.

SUMMARY

In view of this, one of the objectives of the present disclosure is to provide an encoder signal sampling method and device to at least partially solve the above-mentioned problems.

In order to achieve the above objectives, the technical solutions adopted by the present disclosure are as follows.

In a first aspect, the present disclosure provides an encoder signal sampling method. The encoder signal sampling method includes: acquiring a data frequency of an encoder; determining a clock frequency according to the data frequency; generating a high-frequency clock signal based on the clock frequency; sampling an input signal of the encoder based on the high-frequency clock signal to obtain a sampled signal; and performing denoising processing on the sampled signal based on a preset algorithm.

Optionally, sampling the input signal of the encoder based on the high-frequency clock signal to obtain the sampled signal includes: in response to detecting a clock edge of the high-frequency clock signal, determining whether one of preset actions exists based on a communication rate of the encoder, wherein the preset actions include: turning on an insulated gate bipolar transistor, turning off an insulated gate bipolar transistor, turning on a metal oxide semiconductor field effect transistor, and turning off a metal oxide semiconductor field effect transistor; and in response to determining that the one of the preset actions exists, stopping the sampling, and continuing the sampling after a preset duration.

Optionally, the preset duration is 3% to 5% of a valid period determined based on the communication rate of the encoder.

Optionally, performing the denoising processing on the sampled signal based on the preset algorithm includes: determining a plurality of valid durations of the sampled signal and a valid level within each of the plurality of valid durations; in a case where a proportion of the valid level within the each of the plurality of valid durations is greater than or equal to a preset threshold, determining that the sampled signal is the valid level within the each of the plurality of valid durations.

Optionally, in a case where the proportion of the valid level within the each of the plurality of valid durations is greater than or equal to the preset threshold, determining that the sampled signal is the valid level within the each of the plurality of valid durations includes: in a case where a high level within each of the plurality of valid durations is valid and a proportion of the high level is greater than or equal to a preset threshold, determining that the sampled signal is the high level within the each of the plurality of valid durations; and in a case where a low level within each of the plurality of valid durations is valid and a proportion of the low level is greater than or equal to a preset threshold, determining that the sampled signal is the low level within the each of the plurality of valid durations.

Optionally, determining the clock frequency according to the data frequency includes: determining a product of the data frequency and a preset coefficient as the clock frequency.

Optionally, performing the denoising processing on the sampled signal based on the preset algorithm includes: dividing a sampling period of the sampled signal into a plurality of valid periods, wherein the plurality of valid periods are determined based on the communication rate of the encoder; counting proportions of levels of the sampled signal within each of the plurality of valid periods; and determining one of the levels, whose proportion reaches a set threshold, within each of the plurality of valid periods as a valid level of the sampled signal within the each of the plurality of valid periods.

Optionally, different valid periods correspond to different set thresholds.

In a second aspect, the present disclosure provides an encoder signal sampling device. The encoder signal sampling device includes a parameter acquisition unit, a clock frequency determination unit, a signal generation unit, a sampling unit and a denoising unit.

The parameter acquisition unit is configured to acquire a data frequency of an encoder.

The clock frequency determination unit is configured to determine a clock frequency according to the data frequency.

The signal generation unit is configured to generate a high-frequency clock signal based on the clock frequency.

The sampling unit is configured to sample an input signal of the encoder based on the high-frequency clock signal to obtain a sampling signal.

The denoising unit is configured to perform denoising processing on the sampled signal based on a preset algorithm.

Optionally, the sampling unit is configured to, in response to detecting a clock edge of the high-frequency clock signal, determine whether one of preset actions exists based on a communication rate of the encoder, where the preset actions include: turning on an insulated gate bipolar transistor, turning off an insulated gate bipolar transistor, turning on a metal oxide semiconductor field effect transistor, and turning off a metal oxide semiconductor field effect transistor; and in response to determining that the one of the preset actions exists, stopping the sampling, and continuing the sampling after a preset duration.

Optionally, the preset duration is 3% to 5% of a valid period determined based on the communication rate of the encoder.

Optionally, the denoising unit is configured to determine a plurality of valid durations of the sampled signal and a valid level within each of the plurality of valid durations; and the denoising unit is further configured to, in a case where a proportion of the valid level within the each of the plurality of valid durations is greater than or equal to a preset threshold, determine that the sampled signal is the valid level within the each of the plurality of valid durations.

Optionally, the denoising unit is further configured to, in a case where a high level within each of the plurality of valid durations is valid and a proportion of the high level is greater than or equal to the preset threshold, determine that the sampled signal is the high level within the each of the plurality of valid durations; the denoising unit is further configured to, in a case where a low level within each of the plurality of valid durations is valid and a proportion of the low level is greater than or equal to the preset threshold, determine that the sampled signal is the low level within the each of the plurality of valid durations.

Optionally, the clock frequency determination unit is configured to determine a product of the data frequency and a preset coefficient as the clock frequency.

Optionally, the denoising unit is configured to divide a sampling period of the sampled signal into a plurality of valid periods, wherein the plurality of valid periods are determined based on the communication rate of the encoder; counting proportions of levels of the sampled signal within each of the plurality of valid periods; and determining one of the levels, whose proportion reaches a set threshold, within each of the plurality of valid periods as a valid level of the sampled signal within the each of the plurality of valid periods.

Optionally, different valid periods correspond to different set thresholds.

To make the above objectives, features and advantages of the present disclosure more comprehensible, preferred embodiments and accompanying drawings are described in detail below.

BRIEF DESCRIPTION OF DRAWINGS

To more clearly illustrate the technical solutions of the present disclosure, the drawings needed in the embodiments will be briefly described below, it should be understood that the following drawings only illustrate certain embodiments of the present disclosure and therefore should not be considered as limiting the scope, and those skilled in the art can also obtain other related drawings based on the drawings without inventive efforts.

REFERENCE LIST

Figure 1:
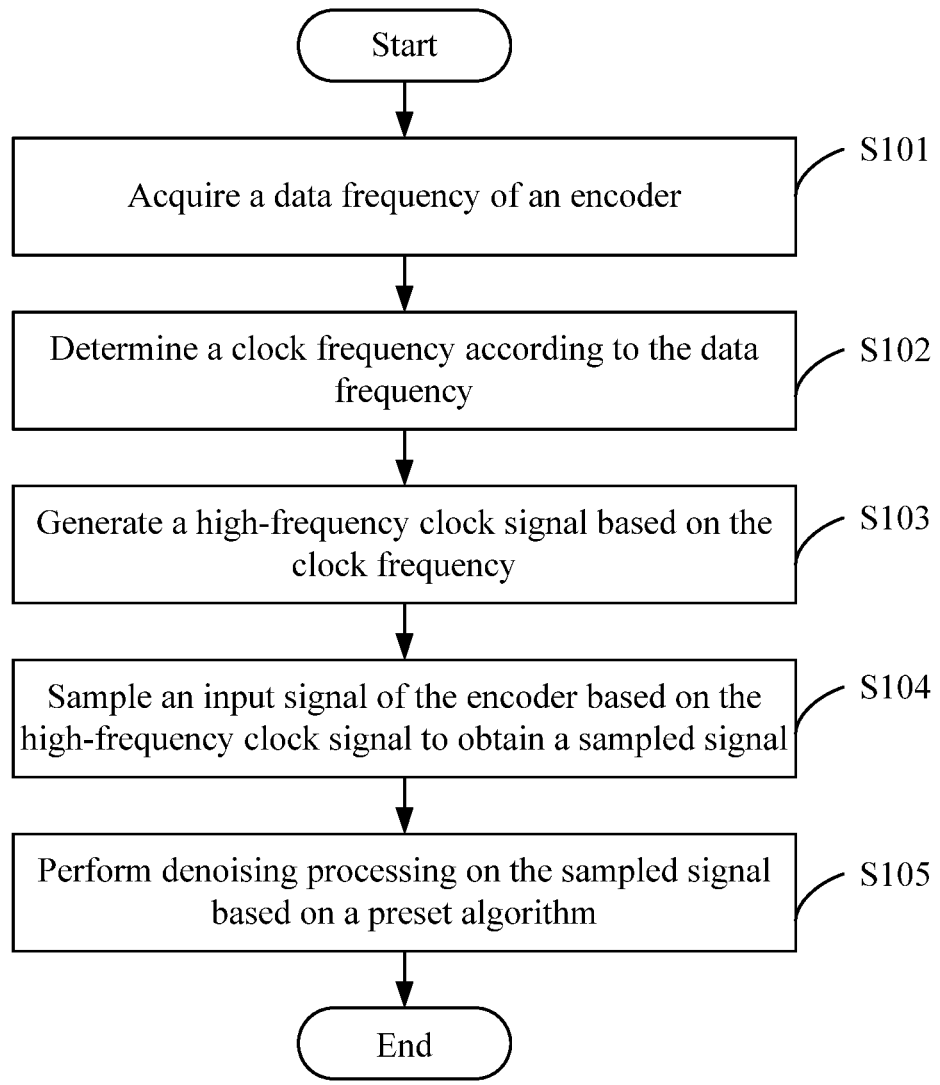
FIG. 1 is a flowchart of an encoder signal sampling method according to the present disclosure.

100 Encoder signal sampling device
110 Parameter acquisition unit
120 Clock frequency determination unit
130 Signal generation unit
140 Sampling unit
150 Denoising unit

DETAILED DESCRIPTION

The technical solutions in the present disclosure will be described below clearly and completely with reference to the accompanying drawings in the present disclosure, and it is to be understood that the described embodiments are only some embodiments of the present disclosure, not all embodiments. The components of the present disclosure generally described and shown in the drawings herein may be arranged and designed in a variety of different configurations.

Therefore, the following detailed description of the embodiments of the present disclosure provided in the accompanying drawings is not intended to limit the scope of the claimed present disclosure, but merely represents selected embodiments of the present disclosure. Based on the embodiments of the present disclosure, all other embodiments obtained by those skilled in the art without creative work shall fall within the scope of the present disclosure.

It is noted that relational terms such as "first" and "second" may be used solely to distinguish one entity or action from another entity or action without necessarily requiring or implying any actual such relationship or order between such entities or actions. Moreover, the terms "comprising", "including" or any other variant thereof is intended to encompass a non-exclusive inclusion so that a process, method, article or equipment that includes a series of elements not only includes those elements but also includes other elements that are not expressly listed or are inherent to such a process, method, article or equipment. Without further limitation, an element defined by the phrase "including a . . . " does not exclude the presence of another identical element in the process, method, article, or equipment that includes the element.

The present disclosure provides an encoder signal sampling method, which is applied to a programmable logic device electrically connected to the encoder. The programmable logic device may be a Field Programmable Gate Array (FPGA) or a Complex Programmable Logic Device (CPLD). The encoder signal sampling method is used to filter out interference noise and improve the accuracy of sampling an input signal of the encoder. Referring to FIG. 1, a flowchart of an encoder signal sampling method provided by the present disclosure is illustrated. The encoder signal sampling method includes the following steps.

In step S101, a data frequency of the encoder is obtained.

It should be noted that the data frequency refers to an output frequency of the encoder. The data frequency is related to the number of pulses generated by the encoder in one revolution or the communication protocol of the encoder.

In step S102, a clock frequency is determined according to the data frequency.

Specifically, a product of the data frequency and a preset coefficient may be determined as the clock frequency.

It should be noted that the clock frequency should be much larger than the data frequency to obtain more sampling points.

Specifically, the clock frequency should be at least 20 times the data frequency to ensure that sufficient sampling points are obtained during subsequent sampling, and the input signal of the encoder is restored as much as possible.

In an alternative embodiment, the preset coefficient is 50.

In step S103, a high-frequency clock signal is generated based on the clock frequency.

Understandably, the high-frequency clock signal is generated by a phase locked loop (PLL) in an FPGA. The phase locked loop is a circuit that controls a frequency and a phase of an oscillation signal in the loop with an external reference signal so as to achieve the automatic tracking of the output signal frequency to the input signal frequency.

In step S104, an input signal of the encoder is sampled based on the high-frequency clock signal to obtain a sampled signal.

Figure 2:
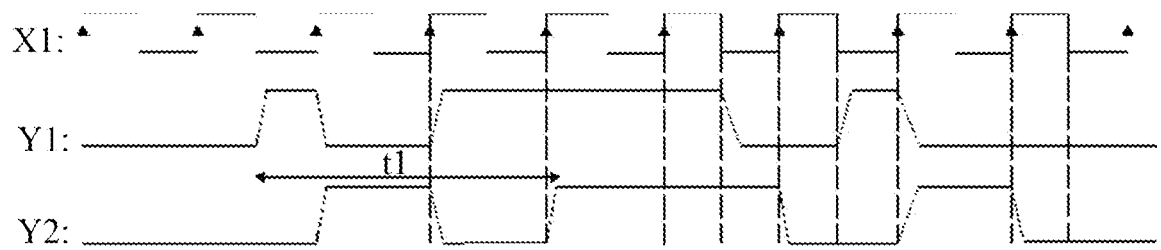
FIG. 2 is a sampling diagram of sampling an input signal of an encoder based on a common clock signal to obtain a sampled signal.

Referring to FIG. 2, a sampling diagram of sampling an input signal of an encoder based on a common clock signal to obtain a sampled signal is illustrated.

Figure 3:
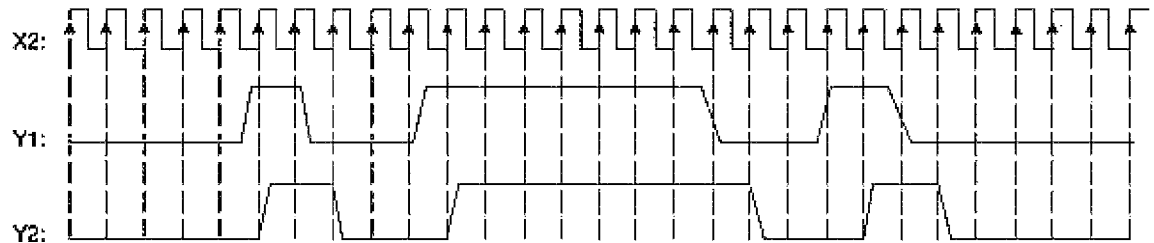
FIG. 3 is a sampling diagram of sampling an input signal of the encoder based on a high-frequency clock signal to obtain a sampled signal.

Referring to FIG. 3, a sampling diagram of sampling the input signal of the encoder based on a high-frequency clock signal to obtain a sampled signal is illustrated.

XI represents a common clock signal, X2 represents a high-frequency clock signal, Y1 represents an input signal, and Y2 represents a sampling signal.

Understandably, by comparing the sampled signals in FIG. 2 and FIG. 3, sampling the input signal of the encoder with the high-frequency clock signal enables more sampling points and sufficient sample signals, and also allows the obtained sampled signal to be more similar to the input signal of the encoder. For example, in FIG. 2, in a waveform within t1 duration, since the frequency of the common clock signal is too large, the obtained sampled signal is completely inconsistent with the input signal of the encoder, and an error occurs.

Optionally, in order to further improve the validity of the sampled signal and the signal-to-noise ratio, the step S104 may include the following processing flow.

In response to detecting a clock edge of the high-frequency clock signal, whether one of preset actions currently exists is determined based on a communication rate of the encoder, if any one of the preset actions exists, sampling is stopped, and the sampling is continued after a preset duration.

The preset actions include turning on an Insulated Gate Bipolar Transistor (IGBT), turning off the IGBT, turning on a Metal Oxide Semiconductor Field Effect Transistor (MOSFET), and turning off the MOSFET.

The preset duration may be 3% to 5% of a valid period. The valid period is determined according to the communication rate of the encoder. For example, if the communication rate of the encoder is 2.5 MHz (400 ns), then the valid period is equal to 400 ns.

In step S105, denoising processing is performed on the sampled signal based on a preset algorithm by a processor.

Figure 4:
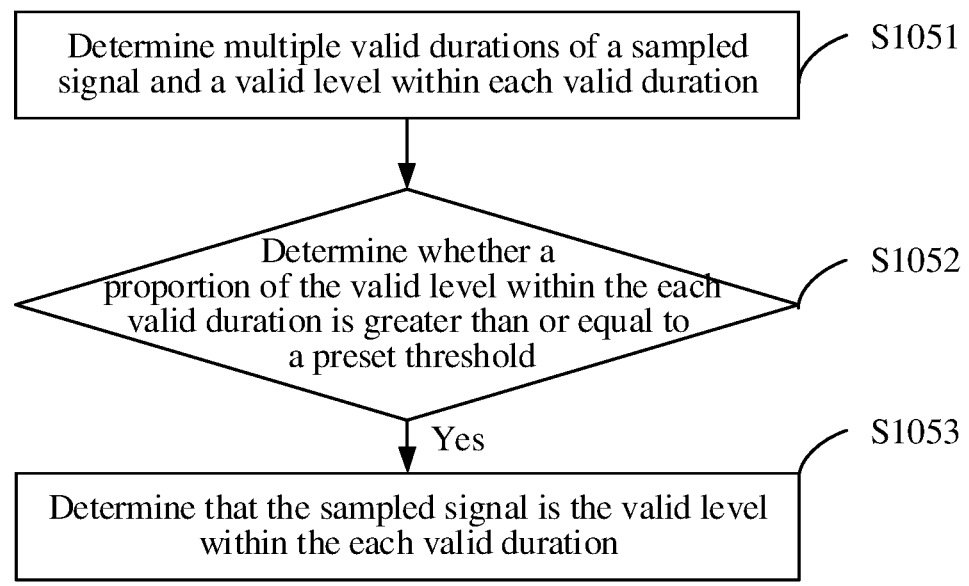
FIG. 4 is a specific flowchart of a step S105 in FIG. 1.

Referring to FIG. 4, a specific flowchart of step S105 in an embodiment is illustrated. The step S105 includes the following sub-steps.

In sub-step S1051, multiple valid durations of the sampled signal and a valid level within each valid duration are determined.

It should be noted that the valid duration has the same meaning as the above valid period, and refers to a length of time, in which data of the encoder is valid, within a sampled signal.

It should be noted that the valid level is a level in the sampled signal other than a level generated by noise. The valid level may be a high level or a low level.

In sub-step S1052, whether a proportion of a valid level within a valid duration is greater than or equal to a preset threshold is determined, and if the proportion of the valid level is greater than or equal to the preset threshold, sub-step S1053 is performed.

Specifically, when a high level within a valid duration is valid, whether a proportion of the high level is greater than or equal to a preset threshold is determined, and if the proportion of the high level is greater than or equal to the preset threshold, sub-step S1053 is performed.

In a case where a low level within a valid duration is valid, whether a proportion of the low level is greater than or equal to the preset threshold is determined, and if the proportion of the low level is greater than or equal to the preset threshold, sub-step S1053 is performed.

In sub-step S1053, it is determined that the sampled signal is the valid level in the valid duration.

In a case where a proportion of the valid level within the valid duration is greater than or equal to the preset threshold, it is determined that the sampling signal is the valid level within the valid duration.

Specifically, in a case where a high level within the valid duration is valid and a proportion of the high level is greater than or equal to the preset threshold, it is determined that the sampled signal is the high level within the valid duration.

In a case where a low level within the valid duration is valid and a proportion of the low level is greater than or equal to the preset threshold, it is determined that the sampled signal is the low level within the valid duration.

It should be noted that the preset threshold should be greater than or equal to 70%.

In another embodiment, the step S105 may be implemented through the following processing flow: dividing a sampling period of the sampled signal into multiple valid periods, the multiple valid periods being determined based on the communication rate of the encoder; counting proportions of levels of the sampled signal within each valid period; and determining one of the levels, whose proportion reaches a set threshold, within each valid period as a valid level of the sampled signal within the each valid period.

The sampling period refers to an entire time span of the sampled signal.

Exemplarily, in each valid period, the sampled signal may have a high level and/or a low level, and each level lasts for a certain time. For example, in a valid period TO, if a proportion of the high level to the valid period TO reaches a set threshold, it can be determined that the valid level of the sampled signal within the valid period TO is the high level. Similarly, in a valid period TO, if a proportion of the low level to the valid period T0 reaches a set threshold, it can be determined that the valid level of the sampled signal within the valid period T0 is the low level.

The set threshold may be determined according to the on-site environment. For example, in a case where the on-site environment is bad, the set threshold may be lower than 70%, otherwise the set threshold may be greater than or equal to 70%. In the embodiment, the meaning of the set threshold is the same as the meaning of the above preset threshold.

Optionally, a sliding window may be used to perform denoising processing on the obtained sampled signal, that is, different set thresholds may be set for different valid periods. In other words, different valid periods correspond to different set thresholds. The size of a set threshold corresponding to a respective valid period may be specifically determined based on the communication rate of the encoder, which is not limited in the embodiment. In this way, the denoising effect can be further improved.

Figure 5:
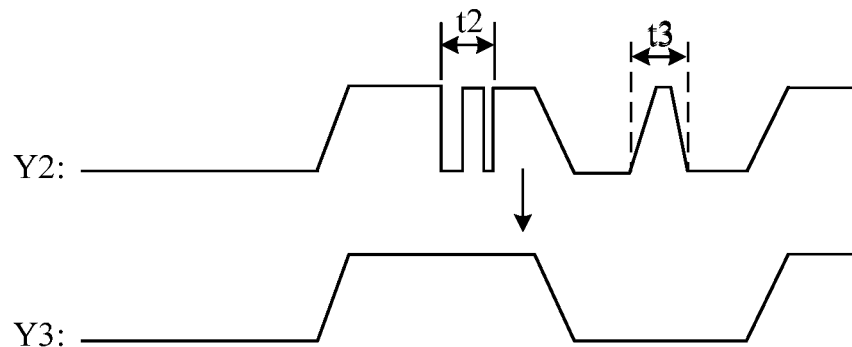
FIG. 5 shows waveform diagrams of a sampled signal before denoising processing and a sampled signal after denoising processing.

Taking FIG. 5 as an example, FIG. 5 shows waveform diagrams of sampled signals before and after denoising processing. Y2 represents a sampled signal, Y3 represents a sampled signal after denoising processing, and t2 and t3 durations indicate noise signals.

Since there are enough sampling points of the sampled signal and the noise signal is usually generated when the MOS transistor of the IGBT module is turned off, sampling points that the noise signal can affect are very few. Then, the noise signal with a small proportion is filtered out by the method provided by sub-steps S1051 to S1054, thereby ensuring the accuracy of the sampled signal.

Figure 6:
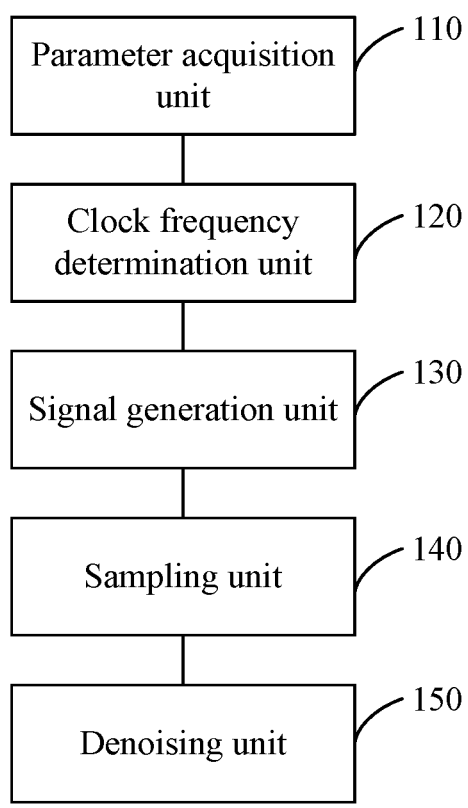
FIG. 6 is a functional block diagram of an encoder signal sampling device provided by the present disclosure.

Referring to FIG. 6, FIG. 6 is a functional block diagram of an encoder signal sampling device 100 according to an embodiment of the present disclosure. It should be noted that the basic principles and technical effects of the encoder signal sampling device 100 provided in the embodiment are the same as those in the above embodiments. For a brief description, for parts not mentioned in the embodiment, reference may be made to the corresponding matters in the above-described embodiments. The encoder signal sampling device 100 includes a parameter acquisition unit 110, a clock frequency determination unit 120, a signal generation unit 130, a sampling unit 140, and a denoising unit 150.

The parameter acquisition unit 110 is configured to obtain a data frequency of the encoder.

Understandably, in an optional embodiment, the parameter acquisition unit 110 may be configured to perform step S101.

The clock frequency determination unit 120 is configured to determine a clock frequency according to the data frequency.

Specifically, the product of the data frequency and a preset coefficient may be determined as the clock frequency.

Understandably, in an optional embodiment, the clock frequency determination unit 120 may be configured to perform step S102.

The signal generation unit 130 is configured to generate a high-frequency clock signal based on the clock frequency.

Understandably, in an optional embodiment, the signal generation unit 130 may be configured to perform step S103.

The sampling unit 140 is configured to sample an input signal of an encoder based on a high-frequency clock signal to obtain a sampling signal.

Understandably, in an optional embodiment, the sampling unit 140 may be configured to perform step S104.

The sampling unit 140 may be specifically configured to, in response to detecting a clock edge of the high-frequency clock signal, determine whether one of preset actions exists based on a communication rate of the encoder, where the preset actions include turning on an insulated gate bipolar transistor, turning off an insulated gate bipolar transistor, turning on a metal oxide semiconductor field effect transistor, and turning off a metal oxide semiconductor field effect transistor; and in response to determining the one of the preset actions exists, stop the sampling, and continue the sampling after a preset duration.

The preset duration accounts for 3% to 5% of the valid period determined based on the communication rate of the encoder.

The denoising unit 150 is configured to perform denoising processing on the sampled signal based on a preset algorithm by a processor.

The denoising unit 150 is configured to determine multiple valid durations of the sampled signal and a valid level within each valid time. The denoising unit 150 is also configured to determine whether a proportion of the valid level within the valid duration is greater than or equal to a preset threshold, and is configured to determine that the sampled signal is the valid level in the valid duration in a case where the proportion of the valid level in the valid duration is greater than or equal to a preset threshold.

Specifically, the denoising unit 150 is further configured to determine whether a proportion of the high level is greater than or equal to a preset threshold in a case where the high level within the valid duration is valid, and if the proportion of the high level is greater than or equal to the preset threshold, determine that the sampled signal is the high level within the valid duration.

The denoising unit 150 is further configured to determine whether a proportion of the low level is greater than or equal to a preset threshold in a case where the low level within the valid duration is valid, and if the proportion of the low level is greater than or equal to the preset threshold, determine that the sampled signal is the low level within the valid duration.

Optionally, the denoising unit 150 is further specifically configured to divide a sampling period of the sampled signal into multiple valid periods, where the valid period is determined based on the communication rate of the encoder; count proportions of levels of the sampled signal within each valid period; and determine one of the levels, whose proportion reaches a set threshold, within each valid period as a valid level of the sampled signal within each valid period.

Optionally, different valid periods correspond to different set thresholds.

Understandably, in an optional embodiment, the denoising unit 150 may be configured to perform step S105.

In summary, according to the encoder signal sampling method and device provided by the present disclosure, the data frequency of the encoder is obtained, the clock frequency is determined according to the data frequency, then the high-frequency clock signal is generated based on the clock frequency, then the input signal of the encoder is sampled with the high-frequency clock signal as a reference to obtain the sampled signal, and finally denoising processing is performed on the sampled signal based on the preset algorithm by a processor; the input signal of the encoder is sampled by utilizing the high-frequency clock signal to obtain more sampling points, so that enough signal samples are obtained for subsequent data analysis and denoising, and the influence of the noise signal on the sampled signal is smaller since a proportion of the valid signal in the signal sample is obviously larger than a proportion of the noise signal under the action of the high-frequency clock signal, thereby ensuring the accuracy of the sampled signal.

It should be understood that the device and the methods disclosed in the embodiments of the present disclosure may be implemented in other ways. The device embodiments described above are merely illustrative and, for example, the flowcharts and block diagrams in the figures illustrate the architecture, functionality, and operation of possible implementations of devices, methods and computer program products according to various embodiments of the present disclosure. In this regard, each block in the flowchart or block diagram may represent a module, program segment, or part of the code, and the module, program segment, or part of the code contains one or more executable instructions for realizing the specified logic function. It should also be noted that in some alternative implementations, the functions marked in the block may also occur in a different order from the order marked in the drawings. For example, two consecutive blocks can actually be executed substantially in parallel, or they can sometimes be executed in the reverse order, depending on the functions involved. It should also be noted that each block in the block diagram and/or flowchart, and the combination of the blocks in the block diagram and/or flowchart, can be implemented by a dedicated hardware-based system that performs the specified functions or actions, or realized by a combination of dedicated hardware and computer instructions. In addition, the functional modules in the various embodiments of the present disclosure may be integrated together to form an independent part, or each module may exist alone, or two or more modules may be integrated to form an independent part. If the function is implemented in the form of a software function module and sold or used as an independent product, it may be stored in a computer readable storage medium. Based on this understanding, the technical solution of the present disclosure essentially or the part that contributes to the existing art or the part of the technical solution may be embodied in the form of a software product, and the computer software product is stored in a storage medium, and includes several instructions for enabling a computer device (which may be a personal computer, a server, a network device or the like) to execute all or part of the steps of the methods described in the various embodiments of the present disclosure. The above storage medium includes a U disk, a mobile hard disk, a Read-Only Memory (ROM), a Random Access Memory (RAM), a magnetic disk or an optical disk and another medium that can store program codes. The above are only selected embodiments of the present disclosure and are not intended to limit the present disclosure, and for those skilled in the art, the present disclosure may have various modifications and variations. Any modifications, equivalent substitutions, improvements and the like made within the spirit and principle of the present disclosure fall within the scope of the present disclosure.

INDUSTRIAL APPLICABILITY

The encoder signal sampling method and device provided in the present disclosure can obtain enough signal samples for subsequent data analysis and denoising, and the influence of the noise signal on the sampled signal is smaller since a proportion of the valid signal in the signal sample is obviously larger than a proportion of the noise signal under the action of the high-frequency clock signal, so that the accuracy of the sampled signal is ensured.

What is claimed is:

1. An encoder signal sampling method, comprising:
   acquiring a data frequency of an encoder;
   determining a clock frequency according to the data frequency;
   generating a high-frequency clock signal based on the clock frequency;
   sampling an input signal of the encoder based on the high-frequency clock signal to obtain a sampled signal; and
   performing denoising processing on the sampled signal based on a preset algorithm.

2. The encoder signal sampling method of claim 1, wherein sampling the input signal of the encoder based on the high-frequency clock signal to obtain the sampled signal comprises:
   in response to detecting a clock edge of the high-frequency clock signal, determining whether one of preset actions exists based on a communication rate of the encoder, wherein the preset actions comprise: turning on an insulated gate bipolar transistor, turning off an insulated gate bipolar transistor, turning on a metal oxide semiconductor field effect transistor, and turning off a metal oxide semiconductor field effect transistor; and
   in response to determining that the one of the preset actions exists, stopping the sampling, and continuing the sampling after a preset duration.

3. The encoder signal sampling method of claim 2, wherein the preset duration is 3% to 5% of a valid period determined based on the communication rate of the encoder.

4. The encoder signal sampling method of claim 3, wherein performing the denoising processing on the sampled signal based on the preset algorithm comprises:
   determining a plurality of valid durations of the sampled signal and a valid level within each of the plurality of valid durations;
   in a case where a proportion of the valid level within the each of the plurality of valid durations is greater than or equal to a preset threshold, determining that the sampled signal is the valid level within the each of the plurality of valid durations.

5. The encoder signal sampling method of claim 2, wherein performing the denoising processing on the sampled signal based on the preset algorithm comprises:
   determining a plurality of valid durations of the sampled signal and a valid level within each of the plurality of valid durations;
   in a case where a proportion of the valid level within the each of the plurality of valid durations is greater than or equal to a preset threshold, determining that the sampled signal is the valid level within the each of the plurality of valid durations.

6. The encoder signal sampling method of claim 1, wherein performing the denoising processing on the sampled signal based on the preset algorithm comprises:
   determining a plurality of valid durations of the sampled signal and a valid level within each of the plurality of valid durations;
   in a case where a proportion of the valid level within the each of the plurality of valid durations is greater than or equal to a preset threshold, determining that the sampled signal is the valid level within the each of the plurality of valid durations.

7. The encoder signal sampling method of claim 6, wherein in a case where the proportion of the valid level within the each of the plurality of valid durations is greater than or equal to the preset threshold, determining that the sampled signal is the valid level within the each of the plurality of valid durations comprises:

in a case where a high level within each of the plurality of valid durations is valid and a proportion of the high level is greater than or equal to a preset threshold, determining that the sampled signal is the high level within the each of the plurality of valid durations; and in a case where a low level within each of the plurality of valid durations is valid and a proportion of the low level is greater than or equal to a preset threshold, determining that the sampled signal is the low level within the each of the plurality of valid durations.

8. The encoder signal sampling method of claim 6, wherein the each of the plurality of valid durations is a length of time, in which data of the encoder is valid, within the sampled signal; and the valid level is a level, other than a level generated by noise, in the sampled signal.

9. The encoder signal sampling method of claim 6, wherein the preset threshold is greater than or equal to 70%.

10. The encoder signal sampling method of claim 1, wherein determining the clock frequency according to the data frequency comprises:

determining a product of the data frequency and a preset coefficient as the clock frequency.

11. The encoder signal sampling method of claim 1, wherein performing the denoising processing on the sampled signal based on the preset algorithm comprises:

dividing a sampling period of the sampled signal into a plurality of valid periods, wherein the plurality of valid periods are determined based on the communication rate of the encoder;

counting proportions of levels of the sampled signal within each of the plurality of valid periods; and determining one of the levels, whose proportion reaches a set threshold, within each of the plurality of valid periods as a valid level of the sampled signal within the each of the plurality of valid periods.

12. The encoder signal sampling method of claim 11, wherein different valid periods correspond to different set thresholds.

13. The encoder signal sampling method of claim 11, wherein determining the one of the levels, whose proportion reaches a set threshold, within the each of the plurality of valid periods as the valid level of the sampled signal within the each of the plurality of valid periods comprises:

in a case where a proportion of a high level within each of the plurality of valid periods reaches a set threshold, determining the high level as a valid level of the sampled signal within the each of the plurality of valid periods; and in a case where a proportion of a low level within each of the plurality of valid periods reaches a set threshold, determining the low level as a valid level of the sampled signal within the each of the plurality of valid periods.

14. An encoder signal sampling device, comprising:
a parameter acquisition unit, which is configured to acquire a data frequency of an encoder;
a clock frequency determination unit, which is configured to determine a clock frequency according to the data frequency;
a signal generation unit, which is configured to generate a high-frequency clock signal based on the clock frequency;
a sampling unit, which is configured to sample an input signal of the encoder based on the high-frequency clock signal to obtain a sampling signal; and
a denoising unit, which is configured to perform denoising processing on the sampled signal based on a preset algorithm.

15. The encoder signal sampling device of claim 14, wherein the sampling unit is configured to:

in response to detecting a clock edge of the high-frequency clock signal, determine whether one of preset actions exists based on a communication rate of the encoder, wherein the preset actions comprise: turning on an insulated gate bipolar transistor, turning off an insulated gate bipolar transistor, turning on a metal oxide semiconductor field effect transistor, and turning off a metal oxide semiconductor field effect transistor; and in response to determining that the one of the preset actions exists, stopping the sampling, and continuing the sampling after a preset duration.

16. The encoder signal sampling device of claim 15, wherein the preset duration is 3% to 5% of a valid period determined based on the communication rate of the encoder.

17. The encoder signal sampling device according to claim 14, wherein the denoising unit is configured to determine a plurality of valid durations of the sampled signal and a valid level within each of the plurality of valid durations; and the denoising unit is further configured to, in a case where a proportion of the valid level within the each of the plurality of valid durations is greater than or equal to a preset threshold, determine that the sampled signal is the valid level within the each of the plurality of valid durations.

18. The encoder signal sampling device of claim 17, wherein the denoising unit is further configured to, in a case where a high level within each of the plurality of valid durations is valid and a proportion of the high level is greater than or equal to the preset threshold, determine that the sampled signal is the high level within the each of the plurality of valid durations;

the denoising unit is further configured to, in a case where a low level within each of the plurality of valid durations is valid and a proportion of the low level is greater than or equal to the preset threshold, determine that the sampled signal is the low level within the each of the plurality of valid durations.

19. The encoder signal sampling device of claim 14, wherein the clock frequency determination unit is configured to determine a product of the data frequency and a preset coefficient as the clock frequency.

20. The encoder signal sampling device of claim 14, wherein the denoising unit is configured to:

divide a sampling period of the sampled signal into a plurality of valid periods, wherein the plurality of valid periods are determined based on the communication rate of the encoder;
counting proportions of levels of the sampled signal within each of the plurality of valid periods;
and determining one of the levels, whose proportion reaches a set threshold, within each of the plurality of valid periods as a valid level of the sampled signal within the each of the plurality of valid periods.

* * * * *